United States Patent
Wang et al.

(10) Patent No.: US 7,518,129 B2
(45) Date of Patent: Apr. 14, 2009

(54) PREVENTING DOSAGE DRIFT WITH DUPLICATE DOSE INTEGRATORS

(75) Inventors: Jih-Hwa Wang, Hsinchu (TW); Otto Chen, Hsinchu (TW); Fang-Chi Chien, Hsinchu (TW); Tung-Li Lee, Jhubei (TW); Pu-Fang Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 259 days.

(21) Appl. No.: 11/416,874

(22) Filed: May 3, 2006

(65) Prior Publication Data

US 2007/0257210 A1 Nov. 8, 2007

(51) Int. Cl.
*G21K 5/00* (2006.01)

(52) U.S. Cl. .............................. 250/492.21; 250/492.3; 324/76.17; 324/537; 324/629; 324/647; 327/167

(58) Field of Classification Search ............ 250/492.21, 250/492.3; 324/76.17, 537, 629, 647; 327/167
See application file for complete search history.

(56) References Cited

U.S. PATENT DOCUMENTS 6,288,402 B1 * 9/2001 Johnson ...................... 250/397

FOREIGN PATENT DOCUMENTS

JP    2001351553 A * 12/2001

OTHER PUBLICATIONS

Evans, P., et al., "5. Ion Implantation, RBS and SIMS," 2004, http://www.ainse.edu.au/winter2004/notes05.pdf, pp. 47-67.

* cited by examiner

*Primary Examiner*—Jack I Berman
*Assistant Examiner*—Michael Maskell
(74) *Attorney, Agent, or Firm*—Slater & Matsil, L.L.P.

(57) ABSTRACT

A method for identifying a drifted dose integrator in an implantation system and an implantation system are provided. The implantation system includes a first dose integrator and a second dose integrator. The first dose integrator includes a first input configured to receive a first current generated from charges carried by implanted ions in a wafer, and a first output configured to output a first accumulated dosage value. The second dose integrator includes a second dose integrator including a second input configured to receive a second current generated from the charges carried by the implanted ions in the wafer, and a second output configured to output a second accumulated dosage value. The implantation system further includes a processing unit comparing the first accumulated dosage value and the second accumulated dosage value to detect a drift in one of the first and the second dose integrators.

19 Claims, 5 Drawing Sheets

PREVENTING DOSAGE DRIFT WITH DUPLICATE DOSE INTEGRATORS

TECHNICAL FIELD

This invention relates generally to manufacturing methods of semiconductor devices, and more particularly to the control of implantation processes.

BACKGROUND

Ion implant is a critical technology in the fabrication of semiconductor devices. Ion implanters are typically used for performing ion implantation processes. The ion implanters are used to provide doping for the semiconductor devices, wherein impurity atoms are introduced to change the electrical properties of semiconductor materials.

A typical ion implantation process includes the steps of creating ions of the desired impurity atoms, using electric fields to accelerate the ions to a required energy, transporting the ions down a beam line to a silicon wafer, and scanning the beam, or moving the silicon wafer, or both, such that uniform dosage in the silicon wafer is accomplished.

All semiconductor fabrication processes use many (typically 15 to 25) steps of ion implantation to create a completed semiconductor device. The primary parameters of ion implantation are species, energy and dose. The species are the types of atoms being implanted, and there are two main categories, N-type and P-type, which are denoted by the electrical activity of the impurity in the semiconductor materials. N-type dopants are usually arsenic or phosphorus and P-type dopants usually include boron. The energy determines how deep into the silicon wafer the ions will go: high energy implants are deep, while low energy implants are shallow. The dose determines how conductive the implanted region will be. All of these parameters are chosen by the transistor designer for each implant step to optimize the device characteristics.

A basic ion implantation system is schematically shown in FIG. 1, which includes an implanter comprising an ion beam generator, a beam manipulation unit, and a process chamber. In the ion beam generator, plasma of the desired implant species is produced, from which ions are extracted. The resulting ion beam may then be passed through a magnet (not shown), so that ions of a particular mass to charge (m/e) ratio are selected. The ion beam that emerges from the magnet is further accelerated during the beam manipulation stage. The ion beam is then projected on the silicon wafer in the process chamber.

Since ions are electrically charged, and only ions with a certain number of charges are selected in a given implantation process, by determining the charges landing on the wafer, the ion dosage can be determined. The dosage determination is typically performed by a dose integrator electrically connected to the wafer, wherein the dose integrator determines the accumulated dosage implanted on the wafer. A schematic diagram of a dose integration process performed by a dose integrator is shown in FIG. 2, wherein a wafer current, which is generated due to the charges carried by ions, is input into the dose integrator and integrated with respect to time. The accumulated charge amount is converted to an accumulated dosage and is used to control the implanter.

In a typical implantation process, a target dosage is predetermined. The dose integrator determines the accumulated dosage by multiplying the current flowing through the dose integrator by the duration for which the current flows. The accumulated dosage is then compared to the target dosage. As soon as the target dosage is reached, the implantation process stops.

The dose integrator typically comprises common circuit components such as resistors, capacitors and operational amplifiers. Therefore, with time, the circuit components may degrade and the detected accumulated dosage may drift from the actual value. As a result, the implanted dosage will deviate from the predetermined value. For example, assume one coulomb of charges is expected by the dose integrator to provide the target dosage, and the charges are supplied by one-ampere current flowing through the dose amplifier for one second. If the dose integrator drifts, and the one-coulomb charges are wrongfully determined to be 0.8 coulombs, the implantation will then last 1.25 seconds instead of one second to make up the difference. As a result, 1.25 coulomb charges actually pass the dose integrator, which means that the corresponding dosage is also 25 percent more than necessary. This will cause degradation of, or even failure of, the resulting integrated circuits on the wafer.

Although dosage integrator drift does not occur frequently, when it occurs, the respective cost is high. Conventionally, periodic monitoring is the only way to catch this problem. However, periodic monitoring cannot catch the problem in real time, and many wafers may be damaged during the period of time from when the drift occurs to when the problem is found by e.g., daily monitoring. For example, up to about 1000 wafers may be manufactured and damaged due to the drift of the dosage integrator. Therefore, a method for catching dosage drift in real time to prevent high loss is needed.

SUMMARY OF THE INVENTION

In accordance with one aspect of the present invention, an implantation system includes a first dose integrator and a second dose integrator. The first dose integrator includes a first input configured to receive a first current generated from charges carried by implanted ions in a wafer, and a first output configured to output a first accumulated dosage value. The second dose integrator includes a second dose integrator including a second input configured to receive a second current generated from the charges carried by the implanted ions in the wafer, and a second output configured to output a second accumulated dosage value. The implantation system further includes a processing unit comparing the first accumulated dosage and the second accumulated dosage to determine a drift in one of the first and the second dose integrators.

In accordance with another aspect of the present invention, an implantation system includes an implanter, a current divider having a current input and a first divider current output and a second divider current output, a first dose integrator coupled to the first divider current output and having a first accumulated dosage output, a second dose integrator coupled to the second divider current output and having a second accumulated dosage output, and a processing unit coupled to the first accumulated dosage output and the second accumulated dosage output.

In accordance with yet another aspect of the present invention, a method for detecting a drift of a dose integrator in an implantation system includes connecting a current divider into a current path wherein the current path is connected to a wafer in an implanter, implanting ions into the wafer, conducting a wafer current generated from ions in the wafer to a current divider wherein the current divider divides the wafer current into a first portion and a second portion, inputting the first portion of the wafer current into a first dose integrator wherein the first dose integrator outputs a first accumulated dosage output, inputting the second portion of the wafer current into a second dose integrator wherein the second dose integrator outputs a second accumulated dosage output, and comparing the first accumulated dosage output and the second accumulated dosage output to determine a drift in one of the first and the second dose integrators.

With two dose integrators connected to one wafer current source, if one dose integrator drifts, the problem can be caught in real time. The possible loss due to over-dosage or under-dosage is thus avoided.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Dose integrators are key elements for dosage control. The dosage provided by an implanter is determined by the dose integrator. Any dosage monitoring based on the value provided by the dose integrator is unlikely to serve its purpose if the dose integrator itself drifts, and a reference device external to the sole dose integrator must be used to monitor the performance of the dose integrator.

Figure 1:
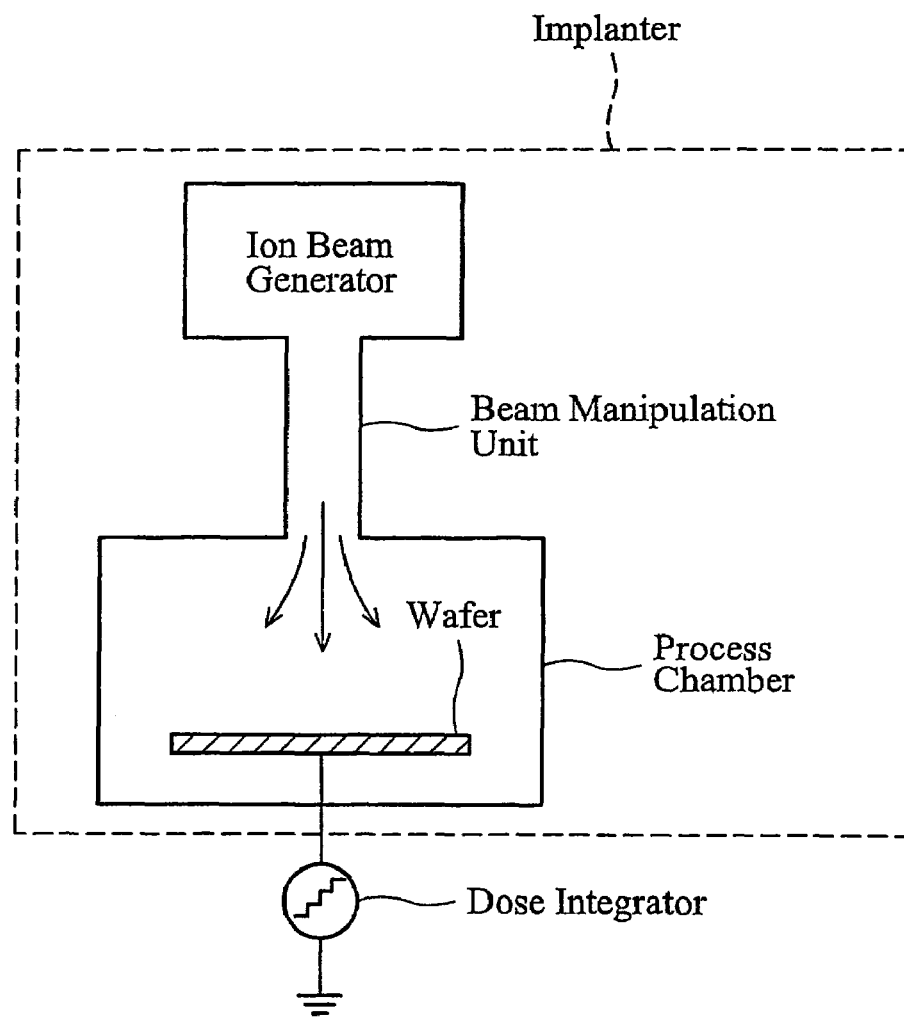
FIG. 1 illustrates a schematic diagram of a conventional implantation system.
Figure 2:
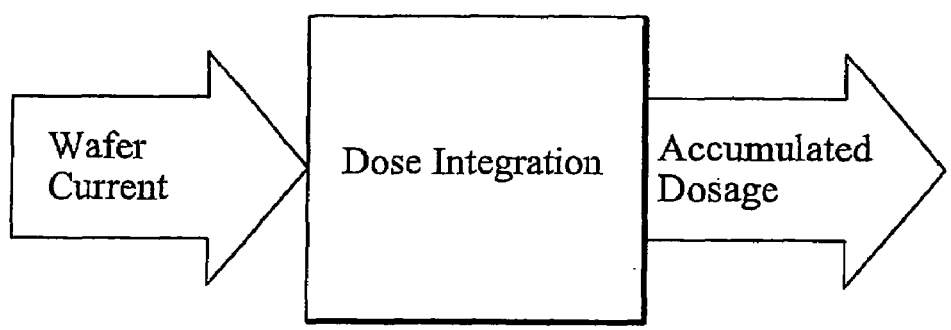
FIG. 2 illustrates a schematic diagram of a conventional dose integration workflow.
Figure 3:
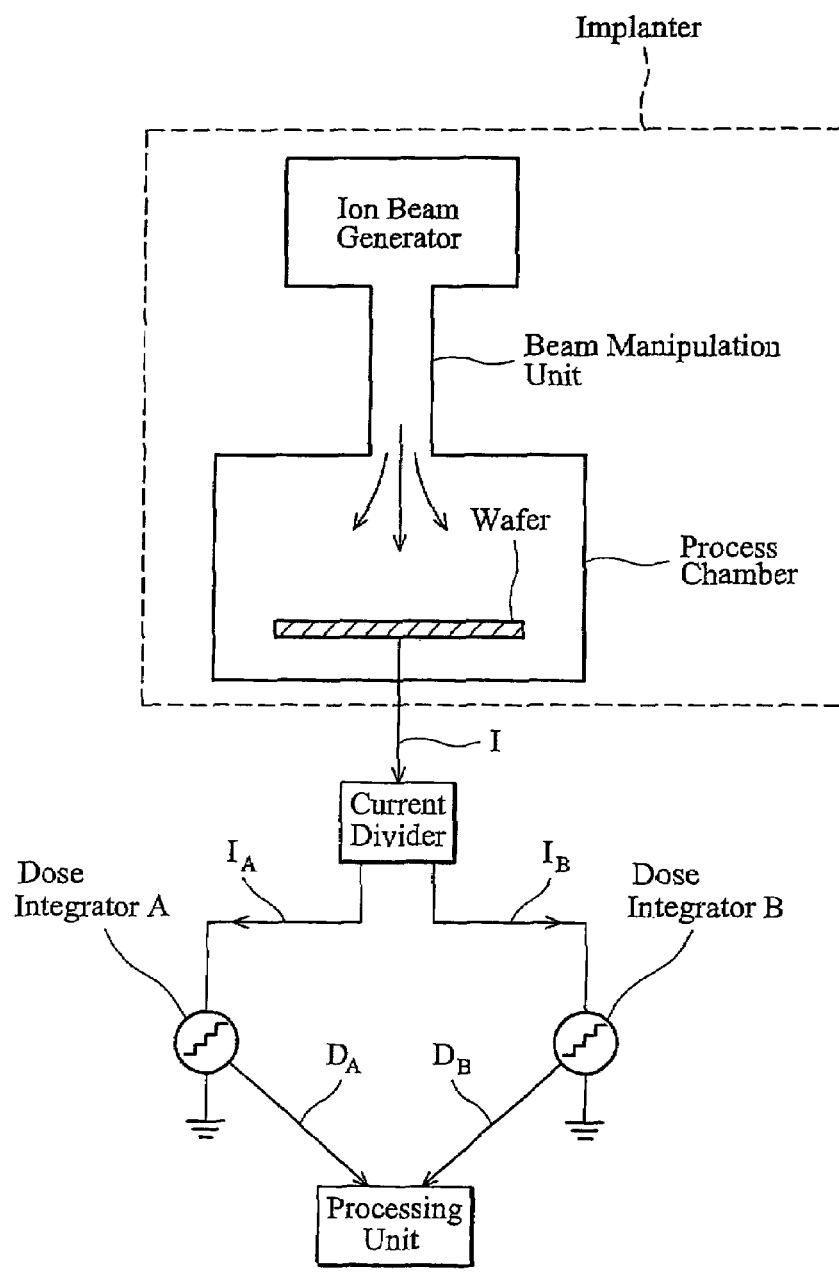
FIG. 3 illustrates a schematic diagram of a preferred embodiment of the present invention, wherein two dose integrators are electrically coupled to a wafer.

A schematic diagram of the preferred embodiment of the present invention is shown in FIG. 3. Note that the diagram is only used for explaining the concept of the present invention, and the present invention may have a variety of different embodiments, hence different connections. In the preferred embodiment, the wafer current I, which is generated from charges carried by ions implanted into the wafer, is input into a current divider. The current divider divides the current I into two substantially equal currents, a current $I_A$ and a current $I_B$, with the currents $I_A$ and $I_B$ having a difference $\Delta I$ of less than about one percent of the wafer current I. Current $I_A$ and current $I_B$ are input into a dose integrator A and a dose integrator B, respectively. Accumulated dose output $D_A$ and accumulated dose output $D_B$, which are the outputs of the dose integrators A and B, respectively, are then processed, preferably by a processing unit. The processing unit is signally connected to the implanter.

Although the processing unit is shown as a separate device, it may be a functional component integrated into the implanter or a dose integrator, etc.

Figure 4:
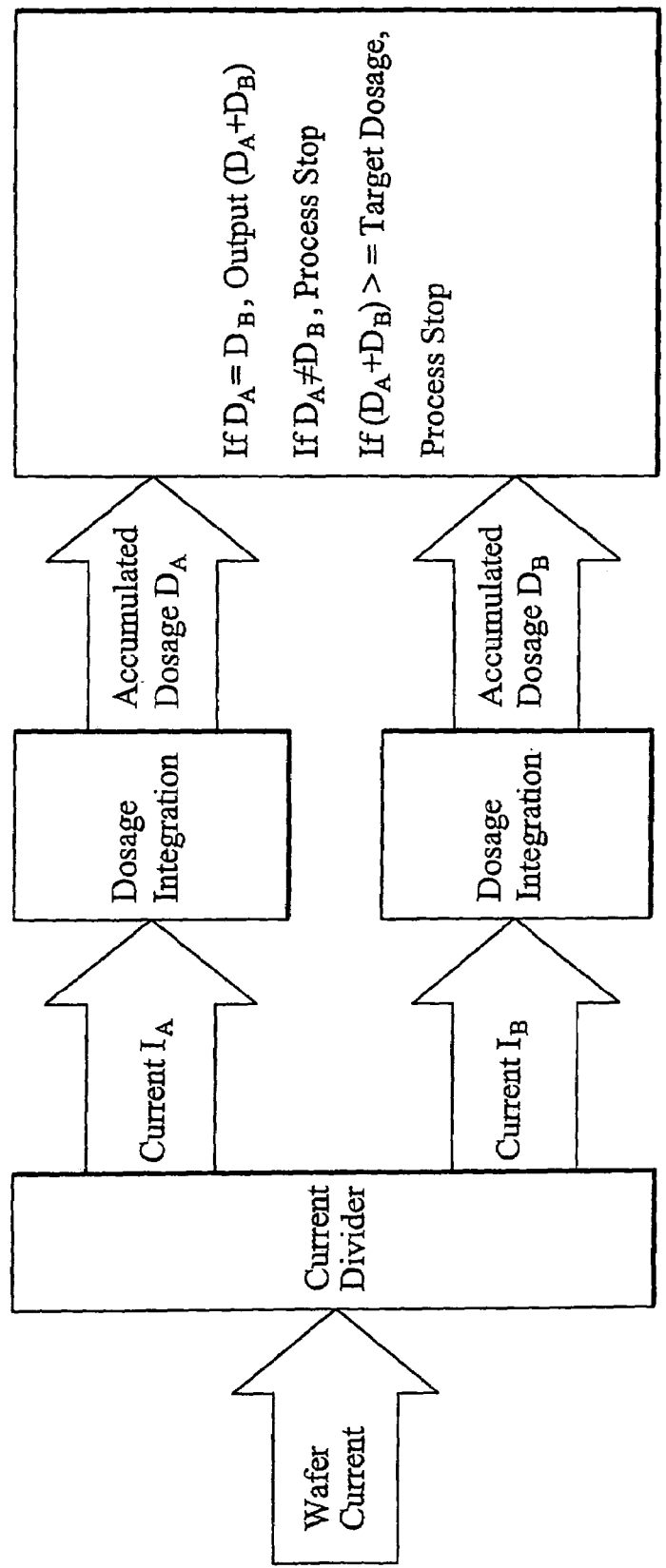
FIG. 4 illustrates a schematic diagram of the workflow of an integration process in the preferred embodiment of the present invention.

A schematic diagram of an exemplary workflow of a dose integration process is shown in FIG. 4, which illustrates that after the wafer current I is divided, each of the currents $I_A$ and $I_B$ are continuously sent through separate paths and are accumulated by the dosage integrators A and B, respectively. During the entire implantation process, the accumulated dosage outputs $D_A$ and $D_B$ are compared. If no drift occurs in either of the dosage integrator A and dosage integrator B, the accumulated dosage outputs $D_A$ and $D_B$ will be substantially identical, and the match between the accumulated dosage outputs $D_A$ and $D_B$ depends on the precision of the current divider and the precision of the dosage integrators A and B. In the preferred embodiment, the accumulated dosage outputs $D_A$ and $D_B$ are added by the processing unit. The combined dosage output ($D_A+D_B$) represents the total dosage implanted into the wafer up to the moment. The total dosage ($D_A+D_B$) is then compared to a target dosage. When the target dosage is reached, the implantation process will be stopped.

If, however, one of the dosage integrators A and B drifts, the accumulated dosage outputs $D_A$ and $D_B$ are likely to have a difference that is greater than a maximum allowed error. The maximum allowed error is pre-determined by the user of the implanter, and may be determined based on the design requirements. The difference in accumulated dosage outputs $D_A$ and $D_B$ will be detected by the processing unit, which is signally connected to the implanter. The implantation process will then be stopped, and the cause of the difference will be determined. The dosage integrator having drift will be replaced. If the difference in accumulated dosage outputs $D_A$ and $D_B$ is less than the maximum allowed error, the implantation process will continue.

Although the maximum allowed error can be an absolute dosage value specified for a particular implantation process, a relative maximum allowed error is more preferable. In an exemplary embodiment, the maximum allowed error is about one percent. Accordingly, a relative dosage difference, which is preferably represented by a percentage, is calculated. In an exemplary embodiment, the relative dosage difference is expressed as $|D_A-D_B|/(D_A+D_B)$.

In the previously discussed embodiment, two dose integrators are used, and each acts as a reference to the other. As dose integrators are relatively reliable devices, the likelihood of both dose integrators drifting at the same time is very small, thus the reliability of an implantation system using two dose integrators is very high. Assuming at any moment the probability of one dose integrator drifting is 1/P, wherein P is typically a large number, the probability of two dose integrators drifting at the same time is 1/(P*P). Furthermore, unless two dose integrators drift in the same direction (either higher than the actual value or lower than the actual value) and have the same magnitude, the drifting is still likely to be detected. Therefore, the probability of undetected drift is less than about 1/(P*P). Assuming P is 10,000, 1/(P*P) is as high as $1/10^8$.

Figure 5:
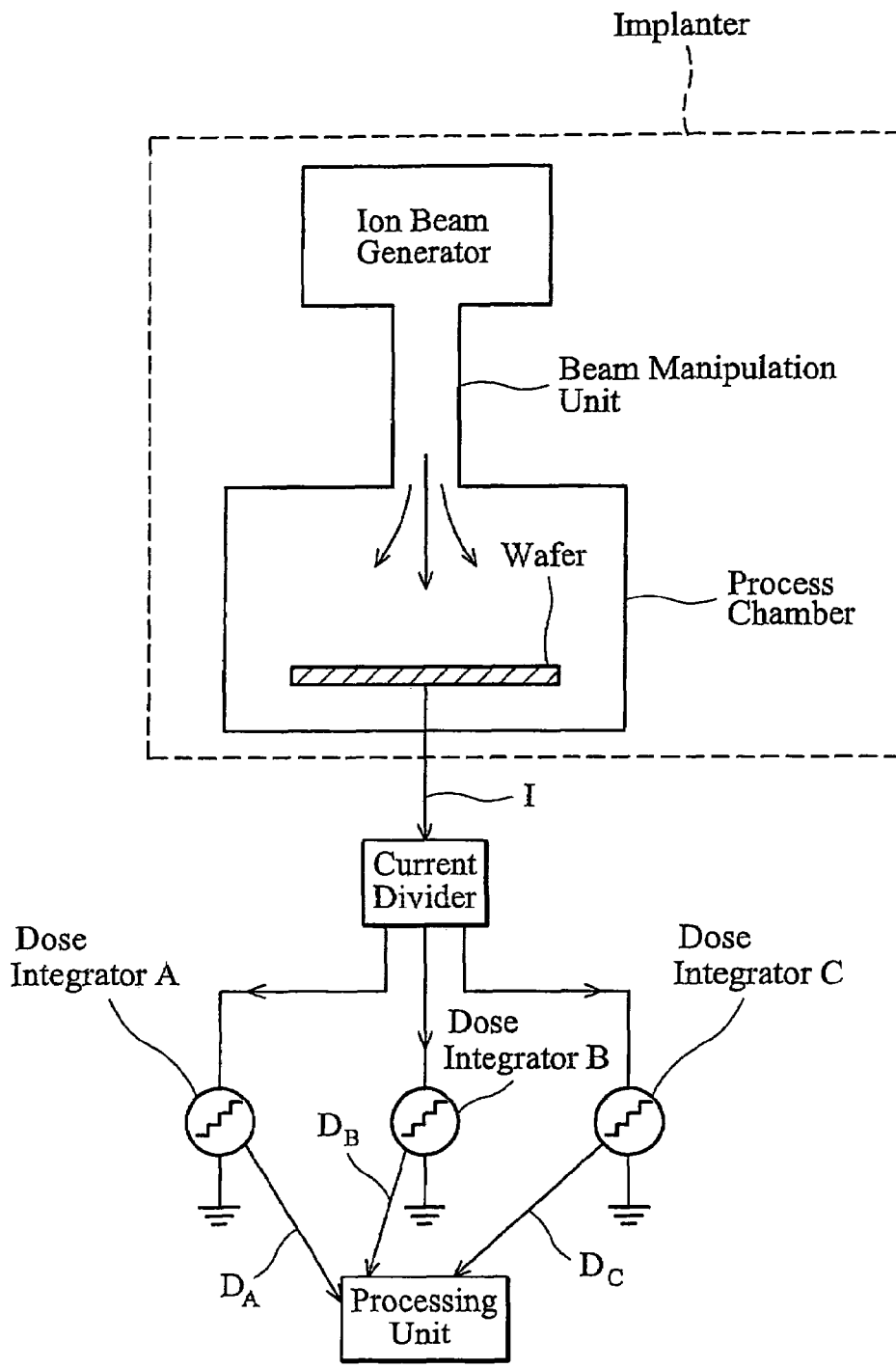
FIG. 5 illustrates a schematic diagram of an embodiment of the present invention, wherein three dose integrators are electrically coupled to a wafer.

One will realize that the preferred embodiment of the present invention has many variations. In other embodiments, more than two dose integrators are used. FIG. 5 illustrates three dose integrators used in the implantation system, although more dose integrators can be used. The wafer current I is preferably divided into three equal shares, each being fed into a dose integrator, namely A, B and C. The accumulated dosage outputs $D_A$, $D_B$ and $D_C$ are then combined as the total dosage. Similarly, by comparing the accumulated dosage outputs $D_A$, $D_B$ and $D_C$, any drift in the dosage integrators A, B and C will be found. It is appreciated that the reliability of an implantation system having three dose integrators is even higher than an implantation system having two dose integrators. However, cost is higher also. One skilled in the art will realize that although not shown in the drawing, implantation systems may have three or more dose integrators if very high reliability is required.

In yet other embodiments, after the current I is divided, currents $I_A$ and $I_B$ (refer to FIG. 3) are amplified by the current divider to the original value of I, and the amplified currents are input into the dosage integrators A and B. Preferably, only the output of one of the dosage integrators is used to determine the process end point, and the other dosage integrator is only used for monitoring purposes. Therefore, in these embodiments, the current divider may generate currents that, when added, do not equal to the wafer current I.

In yet other embodiments, the current divider may divide current I into non-equal shares. A calibration process is preferably performed by the processing unit, which adjusts the comparison process accordingly. For example, a current divider divides the current I into a current equaling 0.49*I, which is input into the dose integrator A, and a current equaling 0.51*I, which is input into the dose integrator B. In the calibration process, the ratio of the unevenly divided currents is identified. The relative difference of the accumulated dosages $D_A$ and $D_B$ is then adjusted accordingly to be $|D_A - 0.49/0.51 * D_B|/(D_A + D_B)$. An advantageous feature of the non-equal current dividing is that with a calibration process being performed, low precision and low cost current dividers can be used without compromising the precision of the implantation system.

The preferred embodiments of the present invention significantly improve the reliability of implantation systems. The cost of the extra dose integrator is low compared to the likely loss due to the damaged wafers. For example, if daily monitoring is performed, an implanter may produce about 1000 defective wafers due to the dose integrator drift between two monitoring, which will result in a loss of over one hundred times the cost of the additional dose integrator.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An implantation system comprising:
    a first dose integrator comprising:
        a first input configured to receive a first current generated from charges carried by implanted ions in a wafer, and
        a first output configured to output a first accumulated dosage value;
    a second dose integrator comprising:
        a second input configured to receive a second current generated from the charges carried by the implanted ions in the wafer, and
        a second output configured to output a second accumulated dosage value; and
    a current divider to generate the first current and the second current from the charges carried by the implanted ions in the wafer.

2. The implantation system of claim 1 further comprising a processing unit comparing the first accumulated dosage and the second accumulated dosage to detect a drift in at least one of the first and the second dose integrators.

3. The implantation system of claim 1, wherein the first current and the second current are substantially equal.

4. The implantation system of claim 1 further comprising a third dose integrator including a third input configured to receive a third current generated from the charges carried by the implanted ions in the wafer, and a third output configured to output a third accumulated dosage value, and wherein the first, the second and the third accumulated dosage values are used for determining a drift in one of the first, the second and the third dosage integrators.

5. An implantation system comprising:
    an implanter;
    a current divider having a current input, a first divider current output, and a second divider current output;
    a first dose integrator coupled to the first divider current output and having a first accumulated dosage output;
    a second dose integrator coupled to the second divider current output and having a second accumulated dosage output; and
    a processing unit coupled to the first accumulated dosage output and the second accumulated dosage output.

6. The implantation system of claim 5, wherein the first divider current output and the second divider current output are substantially equal.

7. The implantation system of claim 5, wherein the first divider current output and the second divider current output have a difference of less than about one percent of a sum of the first divider current output and the second divider current output.

8. The implantation system of claim 5, wherein the first divider current output and the second divider current output are substantially different.

9. The implantation system of claim 5 further comprising a third dose integrator coupled to a third divider current output and having a third accumulated dosage output, wherein the processing unit compares the first, the second and the third accumulated dosage outputs to detect a drift in one of the first, the second and the third dosage integrators.

10. The implantation system of claim 5, wherein the processing unit is signally connected to the implanter, and wherein the processing unit stops the implanter when a drift is identified.

11. A method of fabricating a semiconductor device comprising:
    connecting a current divider into a current path, the current path being connected to a wafer in an implanter;
    implanting ions into the wafer;
    conducting a wafer current generated from the ions to a current divider, wherein the current divider generates a first current and a second current from the wafer current;
    inputting the first current into a first dose integrator, wherein the first dose integrator outputs a first accumulated dosage output;

inputting the second current into a second dose integrator, wherein the second dose integrator outputs a second accumulated dosage output; and comparing the first accumulated dosage output and the second accumulated dosage output to detect a drift in one of the first and the second dose integrators.

12. The method of claim 11 further comprising stopping the step of implanting the ions into the wafer when the drift is detected.

13. The method of claim 11, wherein the drift is detected when a relative difference between the first accumulated dosage output and the second accumulated dosage output is greater than about one percent of a combined dosage output of the first and the second accumulated dosage outputs.

14. The method of claim 11, wherein the current divider divides the wafer current into the first current and the second current.

15. The method of claim 11, wherein the first current and the second current are substantially equal.

16. The method of claim 11, wherein the first current and the second current are substantially different.

17. The method of claim 11 further comprising a calibration process to calibrate the first and the second accumulated dosage outputs.

18. An implantation system comprising:
a first dose integrator comprising:
　　a first input configured to receive a first current generated from charges carried by implanted ions in a wafer, and
　　a first output configured to output a first accumulated dosage value;
a second dose integrator comprising:
　　a second input configured to receive a second current generated from the charges carried by the implanted ions in the wafer; and
　　a second output configured to output a second accumulated dosage value;
a processing unit comparing the first accumulated dosage and the second accumulated dosage to detect a drift in at least one of the first and the second dose integrators;
an electrical node connected to the wafer; and
a current divider connected to the electrical node and generating the first current and the second current from a current flowing through the electrical node, wherein the current divider comprises:
　　a first output connected to the first input of the first dose integrator; and
　　a second output connected to the first input of the second dose integrator.

19. The implantation system of claim 18, wherein the first and the second currents are substantially equal to each other.

* * * * *